United States Patent [19]
Jensen

[11] Patent Number: 5,831,424
[45] Date of Patent: Nov. 3, 1998

[54] ISOLATED CURRENT SENSOR

[75] Inventor: Poul A. Jensen, San Antonio, Tex.

[73] Assignee: Southwest Research Institute, San Antonio, Tex.

[21] Appl. No.: 641,487

[22] Filed: May 1, 1996

[51] Int. Cl.$^6$ ................................................. G01R 33/00
[52] U.S. Cl. ..................................... 324/117 R; 324/99 R
[58] Field of Search ........................... 324/117 R, 99 R, 324/126, 127

[56] References Cited

U.S. PATENT DOCUMENTS

| | | | |
|---|---|---|---|
| 2,605,302 | 7/1952 | Specht | 171/95 |
| 2,721,974 | 10/1955 | Schmitt | 324/43 |
| 2,760,158 | 8/1956 | Kerns | 324/99 R |
| 2,836,791 | 5/1958 | Kaplan | 324/117 R |
| 3,007,106 | 10/1961 | Bergh et al. | 324/127 |
| 3,135,911 | 6/1964 | Allen | 324/117 R |
| 3,490,042 | 1/1970 | Darrow | 324/117 |
| 3,699,442 | 10/1972 | Riley | 324/117 R |
| 4,274,052 | 6/1981 | Gentry, Jr. et al. | 324/117 |
| 4,286,211 | 8/1981 | Nakamura et al. | 324/117 R |
| 5,132,608 | 7/1992 | Nishifuji et al. | 324/99 R |

*Primary Examiner*—Ernest F. Karlsen
*Assistant Examiner*—Anh Phung
*Attorney, Agent, or Firm*—Kammer & Huff, PLLC

[57] ABSTRACT

An improved isolated current sensing device. The invention consists of two magnetizable cores which surround the conductor carrying the current to be measured. The two cores are cyclically saturated in opposite directions by a high-frequency excitation current counter-wound around the two cores. The device then detects through an output winding the asymmetry in the core magnetic fluxes caused by the current-carrying conductor. The output signal is passed through a phase-sensitive detector tuned to twice the original excitation frequency. Negative feedback is used to stabilize the device.

2 Claims, 1 Drawing Sheet

ISOLATED CURRENT SENSOR

BACKGROUND OF THE INVENTION

1. Field of the Invention

The present invention relates generally to current measuring devices and more specifically to an improved non-contact device for measuring DC and up to 1 kHz AC current flow in a wire by sensing the magnetic field produced by the current.

2. Description of the Related Art

It is well known in the art that balanced magnetometers driven cyclically into and out of saturation by a suitable oscillator may be used for measuring the intensity of a magnetic field and are particularly useful for measuring small changes or anomalies in a magnetic field. This concept is disclosed in U.S. Pat. No. 2,721,974 issued to Schmitt. Because current flowing through a conductor produces a magnetic field around the conductor, that same concept has been extended to devices which measure direct current in a conducting wire as shown in U.S. Pat. Nos. 2,605,302 and 3,490,042, issued to Specht and Darrow, respectively.

U.S. Pat. No. 3,007,106, issued to Bergh et al., provides an early teaching of an electrical current meter which operates by sensing the magnetic field produced by the current being measured. A split magnetic core which serves as a probe is adapted to be coupled to the magnetic field surrounding a conductor carrying the current to be measured. The "clip-on" probe is provided with windings which are excited at a fundamental frequency and which produce an AC output voltage of twice or higher even harmonics of the exciting frequency. The output voltage is, for moderate flux changes, proportional to the magnetic flux produced by the current being measured. The output signal is amplified and applied to a phase sensitive detector whose output in turn feeds an indicating meter. This overall system is stabilized by the use of negative feedback. The above-referenced current meters are limited, however, in that they are only able to measure DC current, they have a limited dynamic range, their output is not linear, they are only useful for measuring high currents, or they have limited high frequency response.

It is, therefore, an object of this invention to provide a compact, non-contact, current sensing device capable of detecting current flow in a wire from DC to 1 kHz AC by measuring the magnetic field associated with the current flow in the wire using two magnetizing cores as a sensor.

It is another object of the present invention to provide an isolated current sensing device excited by a high frequency current which employs an active second harmonic detection circuit.

It is a further object of the present invention to provide active feedback which increases the device's dynamic range and a closed loop configuration which increases the device's linearity.

It is yet another object of the present invention to provide for bipolar current measurement, complete isolation, measurement sensitivity in the sub-milliampere range, ability to measure currents in high-voltage wires, and implementation as a miniaturized device.

Additional objects, advantages and novel features of the invention will be set forth in part in the description which follows, and in part will become apparent to those skilled in the art upon examination of the following, or may be learned by practice of the invention. The objects and advantages of the invention may be realized and attained by means of the instrumentalities and combinations particularly pointed out in the appended claims.

SUMMARY OF THE INVENTION

According to the present invention, the foregoing and other objects and advantages are attained by an electronic device able to measure DC and up to 1 kHz AC current flow in a wire without contacting the wire. The device employs magnetic field sensing, wherein a pair of closed toroidial magnetizing cores, operating as part of a second harmonic flux gate magnetometer, serves as a means for sensing the magnetic field produced by the current to be measured.

As disclosed in an illustrative embodiment, a pair of small closed toroidial coils displaced slightly apart along their central axis are cyclically saturated in opposite directions by a high-frequency excitation current counter-wound around the two cores. A wire carrying the current to be measured is routed through the central portion of the two cores. Current flow in the wire will introduce an asymmetry in the core magnetic fluxes, producing a second harmonic of the excitation frequency in an output signal winding wound around both cores. The source providing the excitation current also provides a signal at twice the source's frequency to a phase-sensitive detector fed by the amplified signal produced by the output signal winding. The output of the phase-sensitive detector is therefore a measure of the asymmetric flux produced by the current to be measured. The amplified output $V_{out}$ from the phase-sensitive detector is amplified and routed to the two cores in a feedback loop, the feedback current $I_{fb}$ thereby urging the current induced magnetic field back to zero. An output from the phase-sensitive detector, or an amplified version of it, represents the desired current measurement.

The apparatus of the invention, using two oppositely saturated magnetizing cores as the current sensor probe, in combination with the detection circuitry, thus accurately measures the direction and magnitude of current flowing in a conducting wire ranging from DC to 1 kHz AC. The measurement is made without contacting the wire carrying the current to be measured and thus only minimally affects the circuit being measured.

Still other objects and advantages of the present invention will become readily apparent to those skilled in this art from the following detailed description, wherein multiple preferred embodiments of the invention are shown and described, simply by way of illustration of the best mode contemplated by the inventor for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE PREFERRED EMBODIMENT

As generally described above, the device of the present invention has practical application in a number of situations.

In general, the current sensor device may be used to measure current flow in a wire from DC to 1 kHz AC while remaining isolated from the wire. More particularly, the device has application as a current sensor in space instrumentation devices due to its miniaturized size, high sensitivity and high linearity.

Figure 1:
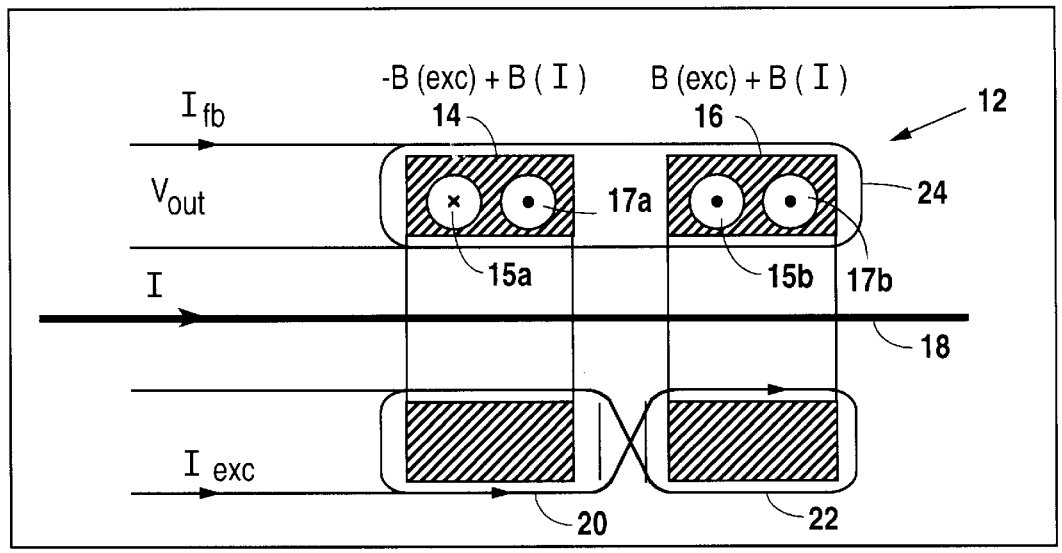
FIG. 1 is a detailed cross-sectional view of the preferred embodiment of the isolated current sensor showing the two magnetizing cores, the wire carrying the current to be measured, the configuration of the windings around the two cores, and relevant voltages, currents, and magnetic fluxes.

Reference is made first, therefore, to FIG. 1 for a description of a preferred embodiment of the sensor element of the current invention. FIG. 1 shows a cross-sectional view of the front-end sensor element (12) of the device of the current invention. The front-end sensor element (12) consists of two cores (14, 16) of magnetizable material. Any material which can be cyclically magnetized by an excitation source into and out of magnetic saturation may be used. The preferred embodiment uses ferrite (Permax 51™) for the material of the cores. The two cores (14, 16) should be closed, symmetrical, and preferably identical in shape. In the preferred embodiment, they must also be able to surround the wire (18) containing the current I to be measured without interruption. The two cores (14, 16) should be placed so that they both are identically affected by the magnetic field induced by and surrounding the current carrying wire (18). In the preferred embodiment, the two cores (14, 16) are placed side by side and not touching, with the wire (18) running along the common central axis to both cores. Ideally, the current carrying wire (18) produces identical magnetic flux having the same magnitude and direction in each of the two cores (14, 16). A miniaturized construction facilitates this configuration.

The first core (14) is partially wrapped by an excitation winding (20) connected to an excitation source (not shown) which drives an excitation current $I_{exc}$ through the winding. The second core (16) is also partially wound by an excitation winding (22). Both excitation windings (20, 22) are connected to the same excitation driving source and carry the same excitation current $I_{exc}$. Both excitation windings also contain the same number of turns. In the preferred embodiment, each excitation winding comprises 30 turns. However, the excitation winding (22) around the second core (16) is wound in a direction opposite to that of the winding (20) on the first core (14). By reversing the direction of the excitation windings (20, 22) on each of the cores (14, 16), the magnetic flux $B_{exc}$ (15a and 15b) induced in each core (14, 16), due to the excitation current, is equal in magnitude but opposite in direction. This is represented in FIG. 1 with magnetic flux (15a) directed into the page and magnetic flux (15b) directed out of the page. In the preferred embodiment, the excitation source which saturates the two cores (14, 16) in opposite directions is a high frequency AC current source operating at a fixed frequency of 15 kHz.

An output winding (24) is wound around both cores (14, 16) in the same direction. The output voltage $V_{out}$ is detected across this output winding (24). The output voltage of the device is the parameter which is proportional to the current I flowing in the wire (18). The output winding (24) is affected by the net magnetic flux within the two cores (14, 16) which is the sum of the magnetic flux $B_{exc}$ (positive and ,negative) caused by the excitation source and the magnetic flux $B_I$ (17a and 17b) (positive) caused by the current I flowing in the wire (18). The output voltage $V_{out}$, measured across the output winding (24) is, for small flux changes, linearly proportional to the net effect of the magnetic flux change in the two cores (14, 16) due to the unknown current I in the conductor (18). The output voltage $V_{out}$ ideally contains only even harmonic frequencies of that of the excitation source.

Figure 2:
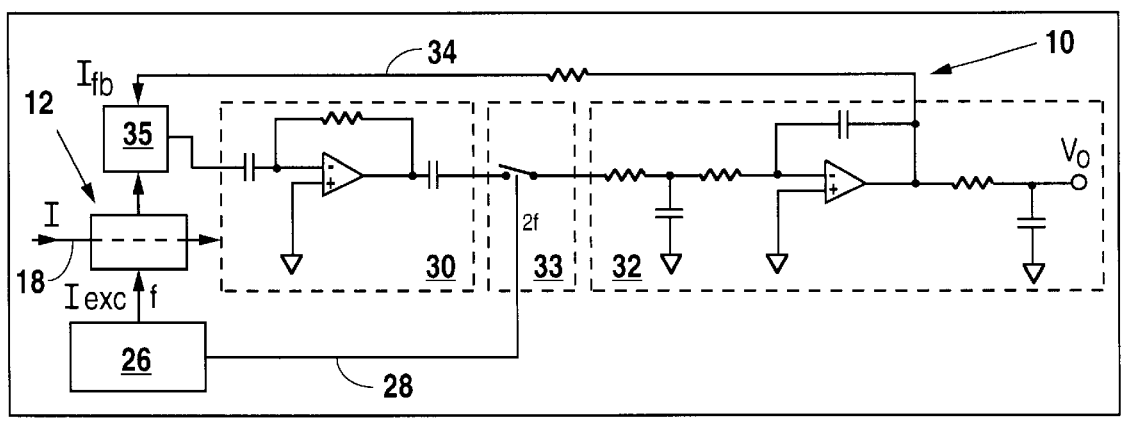
FIG. 2 is a schematic diagram of the current sensor circuitry.

FIG. 2 shows a block diagram for the complete electronic circuitry of a preferred embodiment of the current sensing device (10) of the present invention. The device's front-end sensor (12) is shown with the wire (18) carrying the current I to be measured. An oscillator (26) provides the excitation current source $I_{exc}$ to the front-end sensor (12) at a fixed frequency (f). The oscillator (26) also provides an additional output signal (28) at twice the fixed frequency (2f). This second signal (28) is used by the circuitry of the device (10) as further described below.

The output from the front-end sensor (12), $V_{out}$, is first passed through a filter (30) tuned to twice the fundamental frequency of the oscillator (26). At this point the output voltage may also be amplified as needed. The output from the filter (30) as well as the second oscillator signal (28) are input into a second harmonic synchronous detector (33) whose output voltage $V_o$ is linearly proportional to the current I to be measured in the wire (18). Finally, the preferred embodiment of the present invention is completed with an integrator (32) and a negative feedback loop (34) from the voltage $V_o$ which by way of adder (35) is connected to the front-end sensor (12) to provide a feedback current $I_{fb}$ through the output winding (24). Through this feedback loop (34), the sensitivity of the device (10) may be easily adjusted, and the magnetic cores (14, 16) are forced back to zero magnetic field. This helps to ensure linearity of the device (10).

It is intended that the above description of the preferred embodiment of the structure of the present invention and the description of its method of use is but one enabling best mode embodiment for implementing the invention. Other applications are likely to be conceived by those skilled in the art, which applications still fall within the breath and scope of the disclosure of the present invention. The primary import of the present invention lies in its almost complete isolation from the conductor being monitored. Its benefits derive from its miniaturized size, high sensitivity, high linearity, insensitivity to over-current, and bipolar response. Again, it is understood that other applications of the present invention will be apparent to those skilled in the art upon a reading of the preferred embodiments and a consideration of the appended claims and drawings.

I claim:

1. An isolated current sensor for measuring an unknown current through a conductor comprising:

first and second magnetizable cores surrounding said conductor and located in spaced relation to each other and coaxial with said conductor;

an excitation alternating current source operating at a fixed frequency;

a first excitation winding around said first core, said first winding driven by said excitation current source so as to magnetize said first core into saturation;

a second excitation winding around said second core, said second winding driven by said excitation current source so as to magnetize said second core into saturation in a direction opposite to a direction of said magnetization in said first core;

an output winding around both of said cores for sensing a net magnetic flux in said cores, said net magnetic flux being the sum of the magnetic flux in said first core caused by said excitation current, the magnetic flux in said second core caused by said excitation current, and the magnetic flux in each of said cores caused by said unknown current in said conductor;

a detector for measuring a voltage induced in said output winding, said voltage being directly proportional to said unknown current;

an amplifier for amplifying said induced voltage and producing an output signal; and an output signal feedback circuit comprising an adder for adding said output signal of said amplifier and said output signal from said output winding so as to cancel said magnetic flux change induced by said unknown current.

2. An isolated current sensor for measuring an unknown current through a conductor comprising:

first and second magnetizable cores surrounding said conductor and located in spaced relation to each other and coaxial with said conductor;

an excitation alternating current source operating at a fixed frequency and having two output signals, a first signal at said fixed frequency and a second signal at twice said fixed frequency;

a first excitation winding around said first core, said first winding driven by said first signal of said excitation current source so as to magnetize said first core into saturation;

a second excitation winding around said second core, said second winding driven by said first signal of said excitation current source so as to magnetize said second core into saturation in a direction opposite to a direction of said magnetization in said first core;

an output winding around both of said cores for sensing a net magnetic flux in said cores, said net magnetic flux being the sum of the magnetic flux in said first core caused by said excitation current, the magnetic flux in said second core caused by said excitation current, and the magnetic flux in each of said cores caused by said unknown current in said conductor;

a filter circuit connected to said output winding for isolating and referencing a voltage induced in said output winding and producing a filtered output voltage;

a second harmonic synchronous detector connected to said second signal of said excitation current source and said filtered output voltage said synchronous detector producing an output signal, said output signal being directly proportional to said unknown current; and an output signal feedback circuit connected between said output signal and said output winding which tends to cancel said magnetic flux change induced by said unknown current.

* * * * *